(12) United States Patent
Breems et al.

(10) Patent No.: US 12,015,426 B2
(45) Date of Patent: Jun. 18, 2024

(54) SYSTEM AND METHOD OF REDUCING DELTA-SIGMA MODULATOR ERROR USING FORCE-AND-CORRECTION

(71) Applicant: NXP B.V., Endhoven (NL)

(72) Inventors: Lucien Johannes Breems, Waalre (NL); Muhammed Bolatkale, Delft (NL)

(73) Assignee: NXP B.V., Eindhoven (NL)

( * ) Notice: Subject to any disclaimer, the term of this patent is extended or adjusted under 35 U.S.C. 154(b) by 160 days.

(21) Appl. No.: 17/880,868

(22) Filed: Aug. 4, 2022

(65) Prior Publication Data
US 2024/0048150 A1    Feb. 8, 2024

(51) Int. Cl.
*H03M 3/00* (2006.01)
(52) U.S. Cl.
CPC .................................. *H03M 3/354* (2013.01)
(58) Field of Classification Search
CPC ....... H03M 3/354; H03M 3/434; H03M 3/346
See application file for complete search history.

(56) References Cited

U.S. PATENT DOCUMENTS

| | | | | |
|---|---|---|---|---|
| 6,304,608 B1* | 10/2001 | Chen | ........................ | H03M 3/35 375/252 |
| 6,724,332 B1* | 4/2004 | Melanson | ............. | H03M 7/3011 341/143 |
| 7,116,254 B1* | 10/2006 | Nagai | ...................... | H03M 3/34 341/143 |
| 7,545,303 B1* | 6/2009 | Silva | ...................... | H03M 3/476 341/143 |
| 7,609,189 B1* | 10/2009 | Tu | .......................... | H03M 3/344 341/143 |
| 10,763,888 B1* | 9/2020 | Zhang | .................... | H03M 3/352 |
| 10,998,917 B1* | 5/2021 | Singh | ...................... | H03M 3/49 |
| 11,394,395 B1* | 7/2022 | Zhang | ................... | H03M 3/424 |

(Continued)

FOREIGN PATENT DOCUMENTS

| | | |
|---|---|---|
| EP | 3280055 A1 | 2/2018 |
| EP | 3709518 A1 | 9/2020 |

OTHER PUBLICATIONS

Billa, Sujith et al. "Analysis and Design of Continuous-Time Delta-Sigma Converters Incorporating Chopping." *IEEE Journal of Solid-State Circuits*, vol. 52, No. 9, Sep. 2017 pp. 2350-2361.

(Continued)

*Primary Examiner* — Lam T Mai

(57) ABSTRACT

A delta-sigma modulator including force circuitry that receives an output digital signal and provides a forced digital signal with a predetermined force state based on a force control signal, a combiner that subtracts the forced digital signal from the output digital signal for providing a digital error signal, and force correction circuitry that converts the digital error signal into one or more analog error correction signals applied to corresponding inputs of loop filter circuitry. The digital error signal and the force control signal may each be used to develop corresponding analog feedback signals used to adjust an analog input signal. The digital error signal may also be converted to one or more correction signals applied to corresponding inputs of the loop filter circuitry to correct the output digital signal. The digital error signal may also be used by a digital noise cancellation filter to further correct the output digital signal.

20 Claims, 5 Drawing Sheets

(56) References Cited

U.S. PATENT DOCUMENTS

| | | | | |
|---|---|---|---|---|
| 11,502,699 B1* | 11/2022 | Rutten | .................... | H03M 3/43 |
| 11,522,557 B1* | 12/2022 | Rutten | .................... | H03M 3/38 |
| 2005/0093726 A1* | 5/2005 | Hezar | ................... | H03M 3/412 |
| | | | | 341/143 |
| 2006/0097899 A1* | 5/2006 | Nagai | .................... | H03M 3/48 |
| | | | | 341/143 |
| 2008/0062026 A1* | 3/2008 | Melanson | ............. | H03M 3/412 |
| | | | | 341/155 |
| 2009/0296858 A1* | 12/2009 | Nozawa | ................. | H04L 25/49 |
| | | | | 341/63 |
| 2011/0037629 A1* | 2/2011 | Ceballos | .............. | H03M 3/412 |
| | | | | 341/120 |
| 2014/0077984 A1* | 3/2014 | Shu | ........................ | H03M 3/30 |
| | | | | 341/143 |
| 2015/0171877 A1* | 6/2015 | Huang | ................. | H03M 3/458 |
| | | | | 341/155 |
| 2015/0263759 A1* | 9/2015 | Marienborg | .......... | H03M 3/424 |
| | | | | 341/143 |
| 2020/0343904 A1 | 10/2020 | Ganta et al. | | |

OTHER PUBLICATIONS

Jiang, Hui et al. "Chopping in Continuous-Time Sigma-Delta Modulators." In Conference Proceedings—IEEE International Symposium on Circuits and Systems, ISCAS 2017 pp. 1-4. https://doi.org/10.1109/iscas.2017.8050951.

* cited by examiner

SYSTEM AND METHOD OF REDUCING DELTA-SIGMA MODULATOR ERROR USING FORCE-AND-CORRECTION

BACKGROUND

Field of the Invention

The present invention relates in general to delta-sigma modulators and converters, and more particularly to a system and method of reducing delta-sigma error by applying a forced state with correction by injecting compensation signals.

Description of the Related Art

Delta-sigma (ΔΣ) modulators, including ΔΣ analog-to-digital converters (ADCs), are an important class of data modulators that are widely used in the domain of low-to-medium bandwidth and medium-to-high resolution applications, such as, for example, audio codecs, receiver front-ends for mobile applications, narrow-band and wideband automotive radio receivers using amplitude modulation (AM), frequency modulation (FM), or digital audio broadcasting (DAB), and Frequency Modulated Continuous Wave (FMCW) radar front-ends. Many of these applications require an ADC with very low noise density and very high spectral purity throughout the entire signal band and under any signal condition. Depending on the application and architectural choices, the bandwidth requirements for the ADC can vary over orders of magnitude from very small (e.g., 20 kilohertz (kHz) for an audio codec) to fairly large (e.g., 110 megahertz (MHz) for a mixer-less wideband FM radio front-end) while noise density, linearity and spurious-free-dynamic-range (SFDR) are similar.

To realize the high bandwidth and resolution requirements, ΔΣ modulators are clocked at increasingly higher rates, approaching the gigahertz (GHz) range, taking benefit from the speed capabilities of advanced technology fabrication methods. As the feature sizes scale down with newer technologies, the flicker noise (or 1/f noise, in which "f" denotes frequency) contribution of small devices is increasingly dominating thermal noise. The flicker noise causes errors in ΔΣ modulators.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

Figure 1:
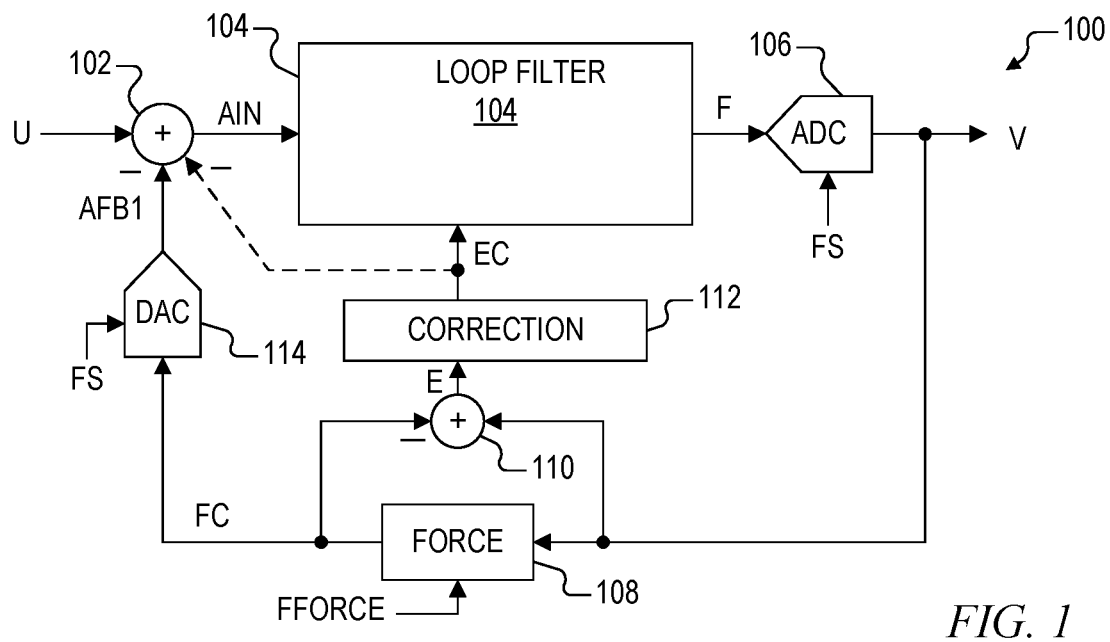
FIG. 1 is a simplified block diagram of a ΔΣ modulator configured as a ΔΣ ADC with force-and-correction implemented according to an embodiment of the present disclosure.

One way of reducing 1/f noise in delta-sigma (Δs) modulators is to increase the device dimensions, but this is at the cost of the speed capability of the transistor and usually is not a feasible solution in high-speed converters. Another technique to mitigate 1/f noise is to employ chopping of the 1/f noise critical part of the amplifier, upconverting the 1/f noise spectral content to frequencies outside the signal band of interest, and creating frequency separation between the signal band and the (dominant part of the) 1/f noise band. There are a few important challenges of employing chopping in high-speed ΔΣ modulators and ADCs. As the application bandwidth can be high (e.g., 110 MHz in the FM radio example), the chopping frequency should be high as well. When chopping at higher rates, the chopper becomes more prone to non-idealities like duty cycle error, time skew, etc. As a result, spectral content, such as out-of-band interferers and high-frequency quantization noise, that is present at the chopping frequency or multiples thereof, can be partly downfolded in the signal band thereby degrading modulator noise, spectral purity, and interference robustness. In particular, the downfolding of quantization noise is problematic since the out-of-band quantization noise of a ΔΣ modulator is very high.

The problem of quantization noise downfolding caused by chopping can be addressed by employing Finite Impulse Response (FIR) digital to analog converters (FIRDACs) or return-to-zero (RTZ) switching. These techniques are generally effective for narrowband (highly oversampled) and low-frequency modulators, such as used in audio applications. A FIRDAC can suppress the quantization noise at specific frequencies, depending on the order of the filter. Deep suppression of the quantization noise is only achieved, however, in a very narrow band, which is insufficient for wideband applications. With RTZ switching, the chopper switching can be done during the zero-state of the DAC, which prevents modulation of data-dependent DAC current with the chopping frequency.

High-frequency GHz ΔΣ modulators, however, usually cannot employ RTZ switching and consequently do not have a periodic zero-state phase that can be used to change the state of the chopper switches. In that case, the quantizer and DAC may be periodically forced to a zero-state or any other suitable steady state or variable value to facilitate the chopper switching. Forcing may be to a zero value, typically referred to as force-to-zero, but may also be forced to any known or predetermined state which may be a fixed state, a selection of any one of multiple fixed states, or even a variable state. Such force application, however, injects periodic errors in the ΔΣ modulator loop. As these errors are introduced at the quantizer, they are noise-shaped according to the modulator noise transfer function (NTF) similar as quantization noise. It is noted here that if the force algorithm is signal-independent (for example a fixed frequency), there are no strict precision requirements for the DAC state. Suppose, for example, a 1-bit modulator is employing force-to-zero switching, then the DAC needs to generate 3 levels [−1, 0, +1]. Even if the 3 DAC output levels have mismatch, the overall modulator remains linear.

An issue with force switching is that due to the periodic forcing of errors in the loop, the maximum stable input range of the modulator is significantly reduced. To mitigate the force error, a correction signal may be injected in the ΔΣ modulator loop in the next clock cycle after the force phase. The output minus the input of force circuitry is a force error which may be delayed by a clock period and added to the DAC input. This way the force error remains small and part of the lost stable large signal range is recovered. The combination of force application and corresponding correction is referred to herein as "force-and-correction." It is noted here that the DAC resolution may be increased with one bit to accommodate for the correction signal. Alternatively, the correction signal can be generated with a separate DAC. As the correction signal may be delayed, however, part of the maximum stable input of the modulator may be lost because the force error is not fully compensated. This loss of maximum range is detrimental in high-performance wideband ΔΣ ADCs as it may lead to more stringent thermal noise density requirements and substantial power increase. The residual error caused by incomplete correction may eventually be corrected by the ΔΣ modulator feedback loop itself, but at the cost of maximum stable input range of the modulator.

A system and method of reducing ΔΣ modulator error using force-and-correction as described herein compensates the force error associated with the force algorithm. Force-and-correction reduces error and improves performance with or without application of chopping. Some embodiments of the correction method described herein inject a feedback correction signal in the ΔΣ modulator loop in the next clock cycle after the force phase. If the feedback correction is incomplete for some configurations, the stable input range of the modulator may be reduced. Other embodiments additionally inject correction signals internally in the modulator, which ensures that the maximum stable input level remains intact even in the presence of many forced errors if required by the algorithm. The error compensation may achieve a maximally stable input without any performance degradation. The correction method is generally applicable to any algorithm that periodically or non-periodically forces the quantizer or DAC to a different state.

FIG. 1 is a simplified block diagram of a ΔΣ modulator 100 configured as a ΔΣ analog-to-digital converter (ADC) with force-and-correction implemented according to an embodiment of the present disclosure. The force-and-correction is applied by injecting correction signals into the modulator loop to recover the stability for a large signal range. The ΔΣ modulator 100 operates to convert an input analog signal U to an output digital signal V. U is provided to one input of an analog input combiner 102 having an output providing an adjusted input signal AIN. AIN is provided to an input of loop filter circuitry 104 having an output providing a filtered signal F. F is provided to an input of an ADC 106 having an output providing the output digital signal V. The ADC 106 operates at a sampling frequency FS. It is noted that the loop filter circuitry 104 may be configured as continuous-time or discrete type filters.

V is fed back to an input of force circuitry 108 that performs a force algorithm for converting V to an output force signal FC in response to a force control signal FFORCE. FFORCE may be a frequency signal that is the same as a chopping frequency FCHOP for configurations using chopping, but may also be a different frequency or have a form controlled by a digital algorithm as further described herein. As previously described, the force algorithm periodically forces its output to a predetermined force state which may be zero or non-zero and which may be fixed or variable, referred to herein as a predetermined force state. V and FC are provided to respective inputs of a digital combiner 110 having an output providing an error signal E. In one embodiment, the combiner 110 operates as an adder which subtracts FC from V to generate the error signal E. The error signal E is provided to an input of force correction circuitry 112, which generates at least one error correction (EC) signal. The EC signal(s) are provided to respective inputs of the loop filter circuitry 104. In addition or in the alternative, an EC signal may also be provided to an input of the input combiner 102. FC is provided to an input of a digital to analog converter (DAC) 114 operating at frequency FS, in which the DAC 114 has an output providing a first analog feedback signal AFB1. AFB1 is provided to another input of the input combiner 102. In one embodiment, the input combiner 102 is configured as an adder which subtracts AFB1 from U to generate the adjusted input signal AIN. For embodiments in which an EC signal is provided to an input of the input combiner 102, the input combiner 102 may also be configured to subtract the EC signal from U to generate AIN.

The loop filter circuitry 104 may include one or more integrators or the like in which at least one integrator which may further include chopping as further described herein. In one embodiment, for example, the loop filter circuitry 104 may be implemented as a cascade of integrators coupled in series. In one embodiment, only the initial integrator of the cascade of integrators incorporates the chopping function, although the chopping function may be applied to one or more integrators or loop filters within the loop filter circuitry 104.

In order to achieve high bandwidth and requisite resolution, the ΔΣ modulator 100 may be clocked at increasingly higher rates such as approaching the gigahertz (GHz) range, taking benefit from the speed capabilities of advanced technology fabrication methods. As the feature sizes scale down with newer technologies, the 1/f flicker noise contribution of small devices increasingly dominates thermal noise causing errors. In some embodiments, choppers are included to employ chopping to mitigate the 1/f noise. At higher bandwidth, however, the frequency of FCHOP should also be relatively high, causing the choppers to be prone to non-idealities such as duty cycle error and time skew and the like. As a result, spectral content, such as out-of-band interferers and high-frequency quantization noise that is present at FCHOP or multiples thereof can be partly downfolded in the signal band thereby degrading modulator noise, spectral purity, and interference robustness.

The problem of quantization noise downfolding caused by chopping or other causes can be addressed by return-to-zero (RTZ) switching as previously described, but such is generally effective only for narrowband applications and not applicable to high-frequency ΔΣ modulators. Thus, the force circuitry 108 is included to periodically force the ΔΣ modulator 100 to a predetermined force state to facilitate chopper switching or other causes. The predetermined force state may be a zero state or non-zero state, which may be any DC-state (including the zero state) or a variable state, which is generally referred to herein as a predetermined force state. Such force application, however, injects periodic errors in the ΔΣ loop. The force correction circuitry 112 is included to compensate and reduce these periodic errors. Various embodiments of the force correction circuitry 112 are described herein for receiving the force error signal E and applying one or more force correction signals EC in the loop for correcting the force error caused by the force circuitry 108. Generally, E may be converted to an analog signal and may also be multiplied by a gain factor to develop EC which is applied at various locations in the loop to implement force-and-correction as further described herein.

Figure 2:
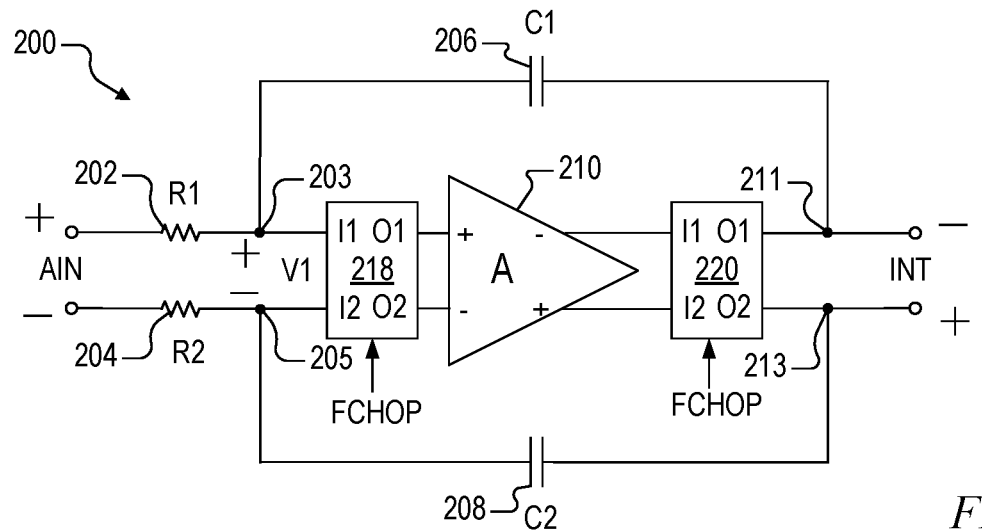
FIG. 2 is a schematic diagram of an integrator that may be used within the loop filter circuitry of FIG. 1 according to one embodiment of the present disclosure, which may or may not include analog choppers.

FIG. 2 is a schematic diagram of an integrator 200 that may be used within the loop filter circuitry 104 according to one embodiment of the present disclosure. The illustrated configuration of the integrator 200 is exemplary only in which it is understood that many different integrator configurations may be used. In the illustrated embodiment, the input and output signals of the integrator 200 have a differential or pseudo-differential signal form in which each of two analog choppers 218 and 220 are configured to swap the polarities of the respective signals at the chopper frequency FCHOP. The output of the integrator 200 is an integrated signal INT, which may be provided to additional loop filters within the loop filter circuitry 104 for developing the filtered signal F. The integrator 200 may be implemented without chopping in which the analog choppers 218 and 220 are not provided as further described herein.

As shown, the input signal AIN includes a positive polarity provided to a first end of a resistor 202 with a resistance R1 and includes a negative polarity provided to a first end of another resistor 204 with a resistance R2. The other end of the resistor 202 is coupled to a node 203 which is further coupled to a first input I1 of the analog chopper 218 and to one end of a capacitor 206 with a capacitance C1. The other end of the resistor 204 is coupled to a node 205 which is further coupled to a second input I2 of the analog chopper 218 and to one end of a capacitor 208 with a capacitance C2. The nodes 203 and 205 form the positive and negative polarities of a voltage V1. The analog chopper 218 has first and second outputs O1 and O2 coupled to noninverting and inverting inputs, respectively, of an amplifier 210. The amplifier 210 has inverting and noninverting outputs coupled to first and second inputs I1 and I2, respectively, of the chopper 220. The chopper 220 has a first output O1 coupled to an output node 211 forming a negative polarity of output voltage INT, in which node 211 is further coupled to the other end of the capacitor 206. The analog chopper 220 has a second output O2 coupled to another output node 213 forming a positive polarity of INT, in which node 213 is further coupled to the other end of the capacitor 208. The polarities of INT are provided to corresponding polarity inputs (not shown) of a next component within the loop filter circuitry 104.

The configuration of the integrator 200 incorporating the analog choppers 218 and 220 is exemplary only in which many different integrator configurations are possible and contemplated. Each of the choppers 218 and 220 swaps its inputs and outputs at the rate of the chopping frequency of FCHOP. A gain A of the amplifier 210 and the values of the resistors and capacitors are chosen to determine the transfer function of the integrator 200. In one embodiment, R1=R2 and C1=C2, although different values may be used in alternative configurations. Normally without the choppers 218 and 220, node 203 is coupled to the noninverting input and node 205 is coupled to the inverting input of the amplifier 210, while the inverting and noninverting outputs of the amplifier 210 are provided to output nodes 211 and 213, respectively. The general configuration of the integrator 200 with or without chopping may be used to implement additional cascaded integrators in the loop filter circuitry 104 with the same or with different transfer functions.

Figure 3:
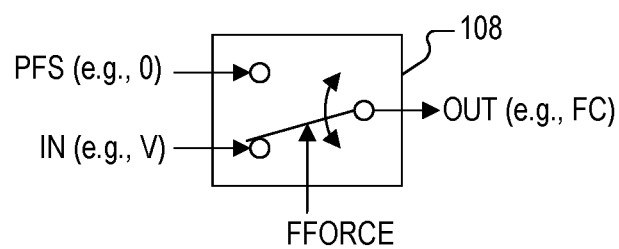
FIG. 3 is a simplified block diagram of the force circuitry of FIG. 1 implemented according to one embodiment of the present disclosure.

FIG. 3 is a simplified block diagram of the force circuitry 108 implemented according to one embodiment of the present disclosure. In the simplified configuration illustrated, the force circuitry 108 includes an internal switch that switches between a predetermined force state (PFS) and an input value IN at the rate of FFORCE for providing an output value OUT. In one embodiment, DC is 0 (force-to-zero) although alternative non-zero fixed or variable values are contemplated. In one embodiment, IN is the V signal which is the output of the $\Delta\Sigma$ modulator 100, and OUT is FC, which is the force signal FC provided to the input of the DAC 114.

Figure 4:
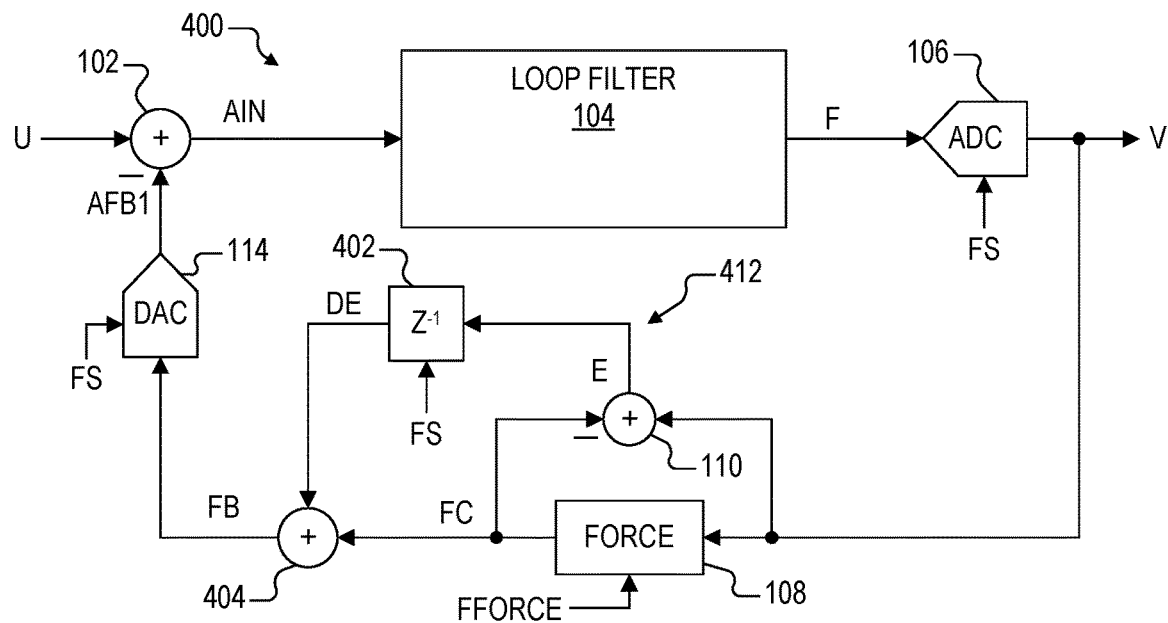
FIGS. 4-10 are simplified block diagrams of ΔΣ modulators configured as ΔΣ ADCs with force-and-correction implemented according to various embodiments of the present disclosure.

FIG. 4 is a simplified block diagram of a $\Delta\Sigma$ modulator 400 configured as a $\Delta\Sigma$ ADC with force-and-correction implemented according to one embodiment of the present disclosure. The $\Delta\Sigma$ modulator 400 is substantially similar to the $\Delta\Sigma$ modulator 100 in which similar components assume identical reference numbers. The input combiner 102, the loop filter circuitry 104, the ADC 106, the force circuitry 108, the combiner 110 and the DAC 114 are included and coupled in substantially similar manner for converting U to V. The loop filter circuitry 104 may or may not be implemented with chopping. In one embodiment as illustrated, the force correction circuitry 112 is implemented as force correction circuitry 412 including delay circuitry 402 operating at frequency FS and a digital combiner 404. In another embodiment, the delay circuitry 402 may be replaced by an arbitrary filter, such as a FIR filter or the like which may or may not be clocked. It is noted that the delay imposed by the delay circuitry 402 may be any type of delay, such as a fractional delay, a delay of one clock cycle, a delay of multiple clock cycles, etc. The delay may be a phase shift or the like and may be implemented as a filter for shaping the response. The error signal E is provided to an input of the delay circuitry 402 having an output providing a delayed error signal DE. The FC and DE signals are provided to respective inputs of the combiner 404 having an output providing a digital feedback signal FB. In one embodiment, the combiner 404 is an adder which adds DE and FC to generate FB, which is provided instead of FC to the input of the DAC 114 for generating the first analog feedback signal AFB1.

In order to mitigate the force error, the DAC 114 injects a correction signal in the form of DE in the next FS clock cycle after the force phase. This correction signal is generated by delaying the force error signal E to provide the DE signal, which is then added to the input via the input combiner 102 via the DAC 114. The DAC 114 may be configured as a FIRDAC or the like. Since this correction signal DE is delayed, however, part of the maximum stable input of the $\Delta\Sigma$ modulator 400 may be lost because the force error is not fully compensated. Nonetheless, substantial improvement over conventional configurations may be achieved.

Figure 5:
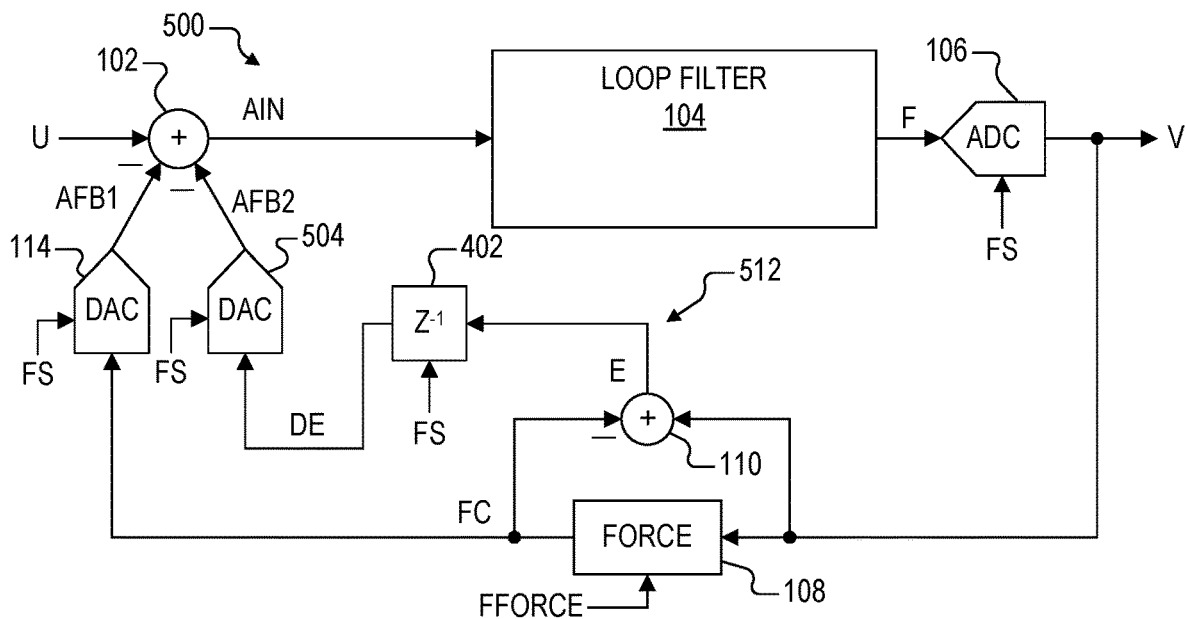

FIG. 5 is a simplified block diagram of a $\Delta\Sigma$ modulator 500 configured as a $\Delta\Sigma$ ADC with force-and-correction implemented according to another embodiment of the present disclosure. The $\Delta\Sigma$ modulator 500 is substantially similar to the $\Delta\Sigma$ modulator 400 in which similar components assume identical reference numbers. The input combiner 102, the loop filter circuitry 104, the ADC 106, the force circuitry 108, the adder 110, the delay circuitry 402 and the DAC 114 are included and coupled in substantially similar manner for converting U to V. The loop filter circuitry 104 may or may not be implemented with chopping. In this case, the force correction circuitry 112 is implemented as force correction circuitry 512 including the delay circuitry 402 and another DAC 504 that replaces the combiner 404. The DAC 504 has an input receiving the delayed error signal DE and has an output providing a second analog feedback signal AFB2 to another input of the input combiner 102. FC is provided directly to the input of the DAC 114. In one embodiment, the input combiner 102 is configured as an adder which subtracts both AFB1 and AFB2 from U to generate AIN.

In order to mitigate the force error, the DAC 504 injects a correction signal in the form of DE after the delay. This correction signal is generated by delaying the force error signal E to provide the DE signal, which is then added to the input via the input combiner 102 via the DAC 504 rather than the DAC 114. Each one or both of the DACs 114 and 504 may be configured as a FIRDAC or the like. The ΔΣ modulator 500 is similar to the ΔΣ modulator 400 in that since the correction signal DE is delayed, part of the maximum stable input of the ΔΣ modulator 500 may be lost because the force error is not fully compensated. Nonetheless, substantial improvement over conventional configurations is achieved.

Figure 6:
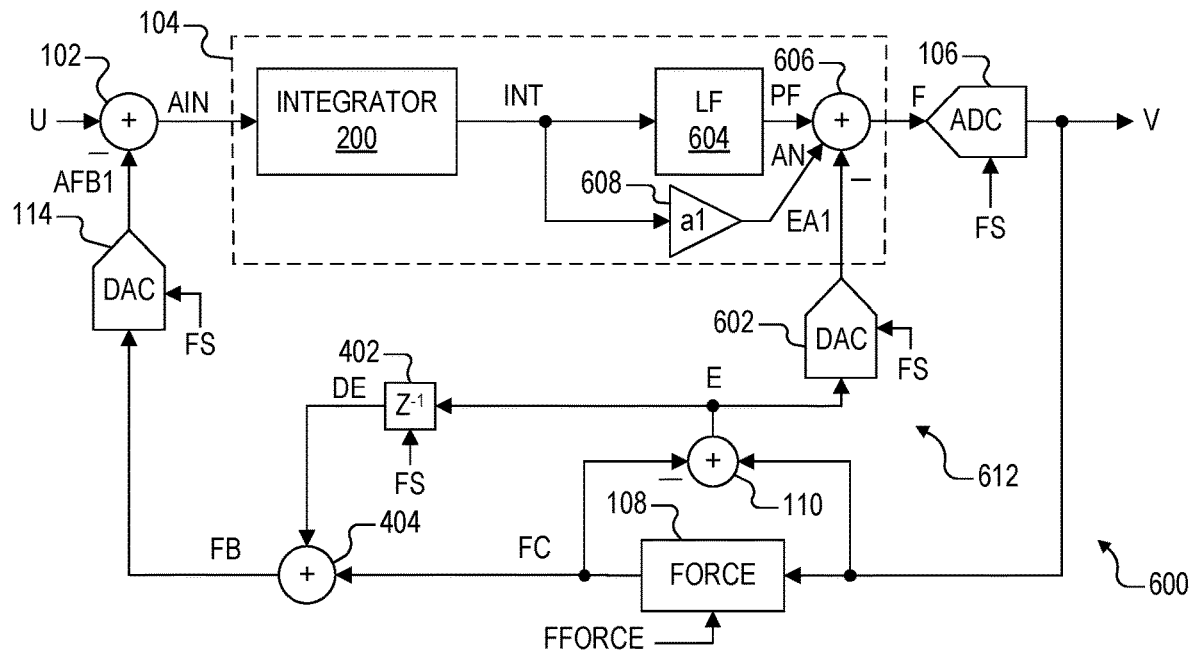

FIG. 6 is a simplified block diagram of a ΔΣ modulator 600 configured as a ΔΣ ADC with force-and-correction implemented according to another embodiment of the present disclosure. The ΔΣ modulator 600 is similar to the ΔΣ modulator 400 in which similar components assume identical reference numbers. The input combiner 102, the loop filter circuitry 104, the ADC 106, the force circuitry 108, the adder 110, the delay circuitry 402, the combiner 404 and the DAC 114 are included and coupled in substantially similar manner for converting U to V. The loop filter circuitry 104 may or may not be implemented with chopping. In this case, the force correction circuitry 112 is implemented as force correction circuitry 612 which includes the delay circuitry 402, the combiner 404, and another DAC 602. The delay circuitry 402 and the combiner 404 are coupled to operate in a substantially similar manner previously described for feeding DE through the DAC 114 to the input combiner 102. The error signal E is additionally provided to an input of the DAC 602 having an output providing a first analog version of E, shown as EA1, which is provided to a selected input of the loop filter circuitry 104 to implement further force error correction.

Further details of the loop filter circuitry 104 are shown for the ΔΣ modulator 600. The INT signal is provided to an input of a loop filter (LF) 604 having an output providing a preliminary filtered signal PF to an input of an analog output combiner 606. An amplifier 608 with gain a1 has an input receiving INT and an output providing an amplified signal AN to another input of the combiner 606. The output combiner 606 combines the PF, AN and EA1 signals to generate and provide the filtered signal F to the ADC 106. In one embodiment, the output combiner 606 operates as an adder which adds PF and AN and subtracts EA1 to generate F. The conversion of E into EA1 by the DAC 602 provides additional compensation for the force error. The error compensation using both of the DACs 114 and 602 achieves a more stable input at higher frequencies with reduced performance degradation. The DACs 114 and 602 may each have separate gain factors, such as 1× or other gain that is empirically determined for best results. In addition, the DAC 602 may be configured as a multi-tap FIRDAC or the like.

The loop filter 604 may be configured in any suitable manner, such as resonators, biquad filters, integrators, etc. The loop filter 604 may also be configured as one or more continuous-time filters or discrete filters or the like. In one embodiment, the loop filter 604 includes one or more additional integrators in which the loop filter circuitry 104 may be configured as a series of cascaded integrators or the like with or without chopping. The gain factor a1 of the amplifier 608 is a feedforward coefficient having a value that is selected to stabilize the loop and ensure first-order behavior of the ΔΣ modulator 600 at higher frequencies.

It is noted that the ΔΣ modulator 600 is configured with feedback error correction similar to the ΔΣ modulator 400 in which an analog version of DE is fed to the input combiner 102 via the combiner 404 and the DAC 114. The feedback error correction of the ΔΣ modulator 600 may instead be configured similar to the ΔΣ modulator 500 in which an analog version of DE is fed to the input combiner 102 via the additional DAC 504.

Figure 7:
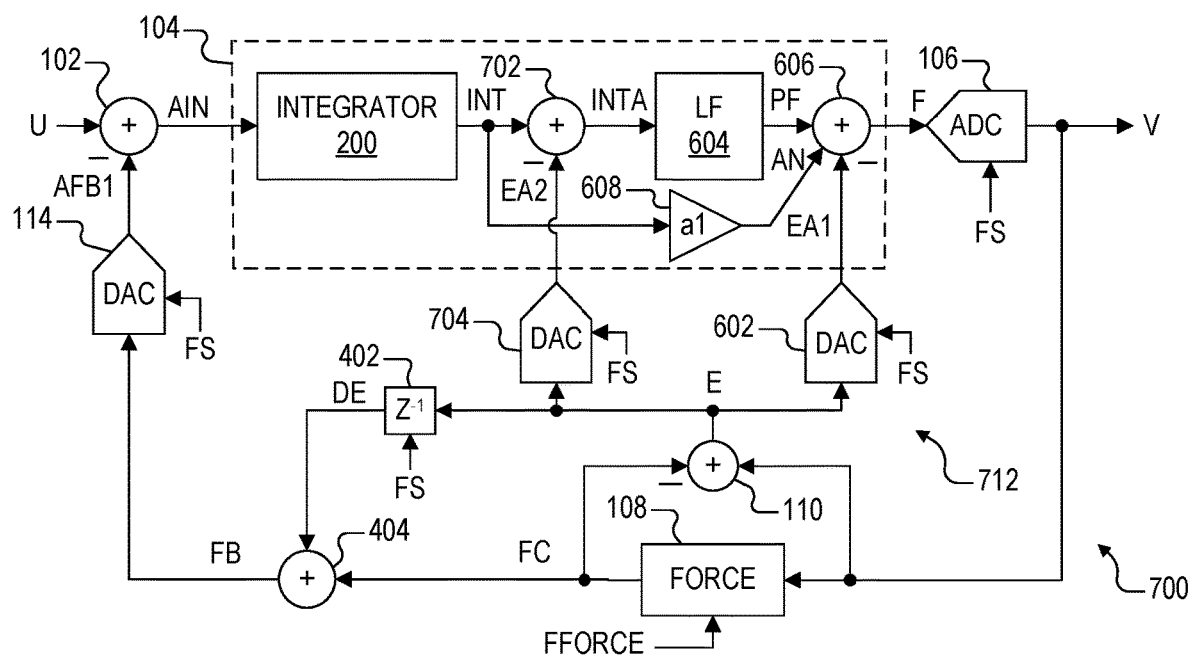

FIG. 7 is a simplified block diagram of another ΔΣ modulator 700 configured as an ΔΣ ADC with force-and-correction implemented according to another embodiment of the present disclosure. The ΔΣ modulator 700 is substantially similar to the ΔΣ modulator 600 in which similar components assume identical reference numbers. The input combiner 102, the loop filter circuitry 104, the ADC 106, the force circuitry 108, the adder 110, the delay circuitry 402, the combiner 404 and the DAC 114 are included and coupled in substantially similar manner for converting U to V. The loop filter circuitry 104 may or may not be implemented with chopping. The loop filter circuitry 104 further includes an analog intermediate combiner 702 inserted between the integrator 200 and the loop filter 604. The intermediate combiner 702 has a first input receiving INT, a second input receiving a feed forward error signal EA2, and an output providing an adjusted integration signal INTA to the input of the loop filter 604. In this case, the force correction circuitry 112 is implemented as force correction circuitry 712 which is similar to the force correction circuitry 612 with the addition of another DAC 704 having in input receiving the error signal E and having an output providing EA2 provided to the intermediate combiner 702. In one embodiment, the intermediate combiner 702 is configured as an adder which subtracts EA2 from INT to generate INTA.

The ΔΣ modulator 700 achieves further correction as compared to the ΔΣ modulator 600 that may be caused by loss of charge in an integrator or within any other filter contained within the loop filter 604. Such error is a residual error that may be reduced by the feedback loop but that nonetheless causes a reduction of performance. The DAC 704 provides EA2 to account for the charge loss or other residual error due to incomplete error correction. In one embodiment, in order to achieve similar results as an ideal case, EA2 may be an average error signal with suitable gain scaled to minimize the residual error. It is noted that gain selection is scaled based on loop filter coefficients. In addition, the DAC 602 may also be configured as a multi-tap FIRDAC or the like.

Figure 8:
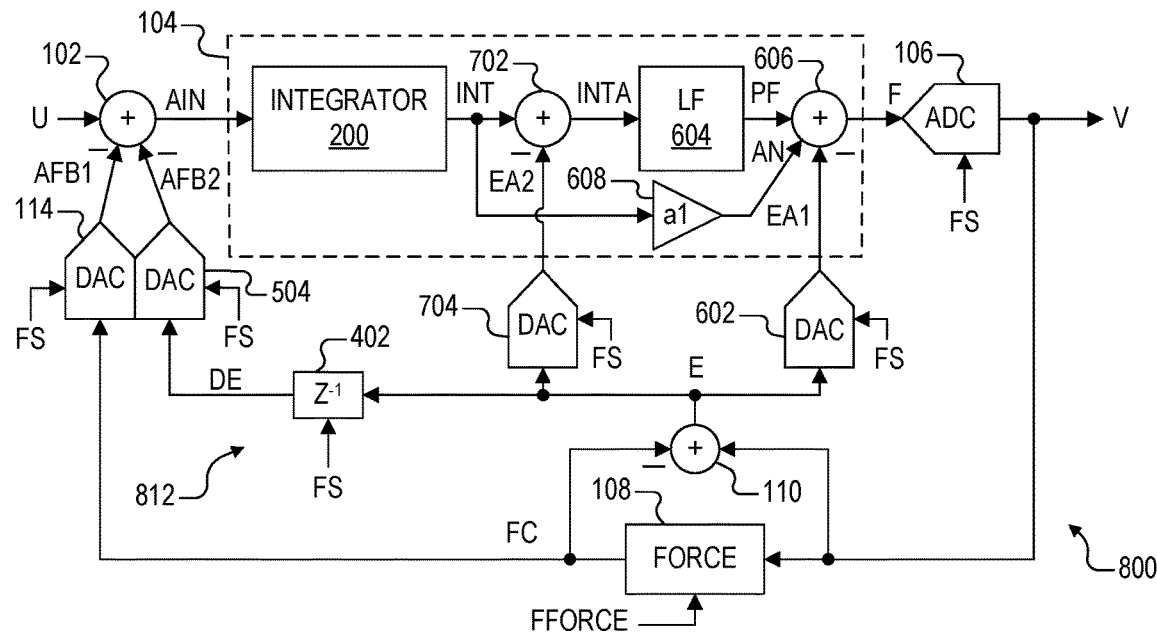

FIG. 8 is a simplified block diagram of another ΔΣ modulator 800 configured as an ΔΣ ADC with force-and-correction implemented according to another embodiment of the present disclosure. The ΔΣ modulator 800 is substantially similar to the ΔΣ modulator 700 in which similar components assume identical reference numbers. The loop filter circuitry 104 may or may not be implemented with chopping. In this case, the force correction circuitry 112 is implemented as force correction circuitry 812 which includes the DACs 602 and 704 along with the DAC 504 in which FC is provided directly to the input of the DAC 114. The DAC 504 has an input receiving the delayed error signal DE and has an output providing the second analog feedback signal AFB2 to another input of the input combiner 102 in a similar manner as the ΔΣ modulator 500. In one embodiment, the input combiner 102 is configured as an adder which subtracts both AFB1 and AFB2 from U to generate AIN.

Although the ΔΣ modulator 700 provides improvement over the ΔΣ modulator 600, residual errors may still remain in the charge of integrators or filters within the loop filter 604. These discrepancies lead to further charging errors in higher-order integrators. The DAC 504 of the ΔΣ modulator 800 may be used to provide additional compensation for these residual errors. The DAC 504 may provide simple fine-tuning sufficient to gain back the full maximum stable input range of the modulator, without the need for full compensation of the force error. Compensation can be adapted by adjusting the gain of the DAC 504. In one embodiment, for example, for certain loop filter coefficients the gain of the DAC 504 may be set to about 1.25, although alternative gain factors are contemplated for different loop filter coefficients. In addition, further compensation may be achieved by adding a linear component via the DAC 704 by implementing it as a multi-tap FIRDAC. Either one or both of the DACs 504 and 602 may also be implemented as multi-tap FIRDACs as well. It is noted that more compensation signals may be injected at other nodes in the loop filter circuitry 104 employing additional DACs or FIRDACs (not shown).

Figure 9:
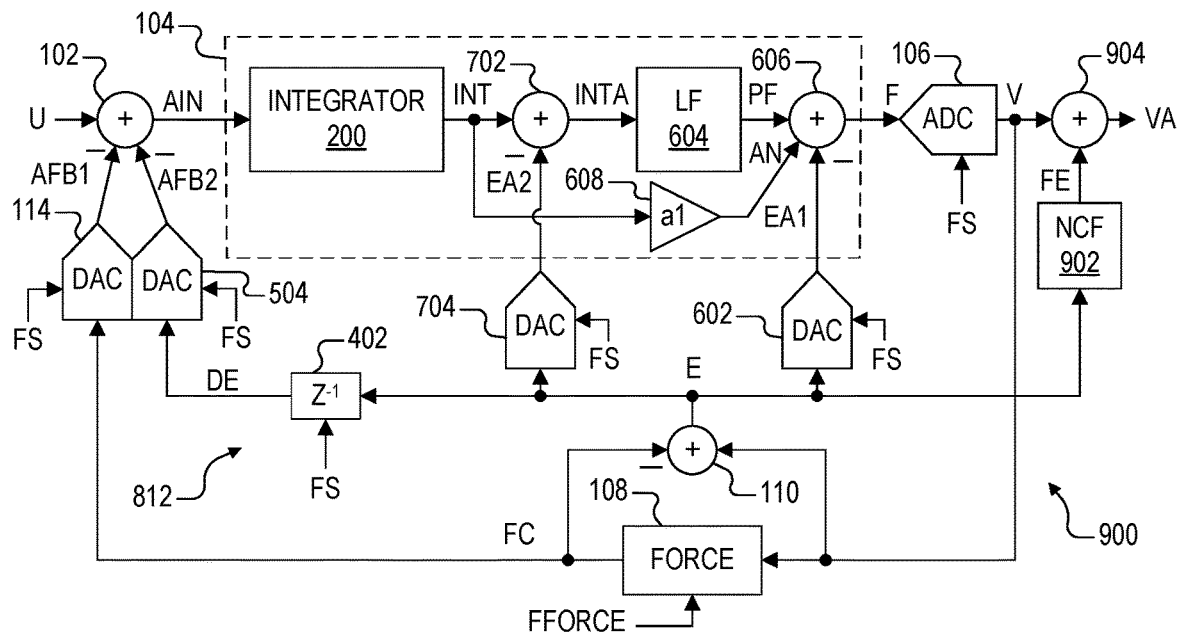

FIG. 9 is a simplified block diagram of another ΔΣ modulator 900 configured as an ΔΣ ADC with force-and-correction implemented according to another embodiment of the present disclosure. The ΔΣ modulator 900 is substantially similar to the ΔΣ modulator 800 in which similar components assume identical reference numbers. The loop filter circuitry 104 may or may not be implemented with chopping. In this case, the force correction circuitry 112 is also implemented as force correction circuitry 812. It is noted that the error correction signal EA2 injected at the intermediate combiner 702 may cause a first-order shaped noise in the output signal V. The ΔΣ modulator 900 further includes a digital noise cancelation filter (NCF) 902 having an input receiving the error signal E and an output providing a filter digital error signal FE. The ΔΣ modulator 900 further includes a digital output combiner 904 having a first input receiving signal V, another input receiving signal FE, and an output providing an adjusted output signal VA. The output combiner 904 may be configured as a digital adder that adds FE to V to generate VA.

The NCF 902 may be configured to remove the noise injected by the correction signal EA2. In one embodiment, the NCF 902 may be configured as a 2-tap FIR filter with coefficients [0.5 0.5] to remove the injected noise, although alternative coefficients values may be used in different configurations. In one embodiment, the gain of the DAC 704 and the coefficient gains of the NCF 402 may be configured to match each other for good noise cancellation. The accuracy of the gains of each of the other error DACs 114, 602 and 504 may have relatively wide variances.

Figure 10:
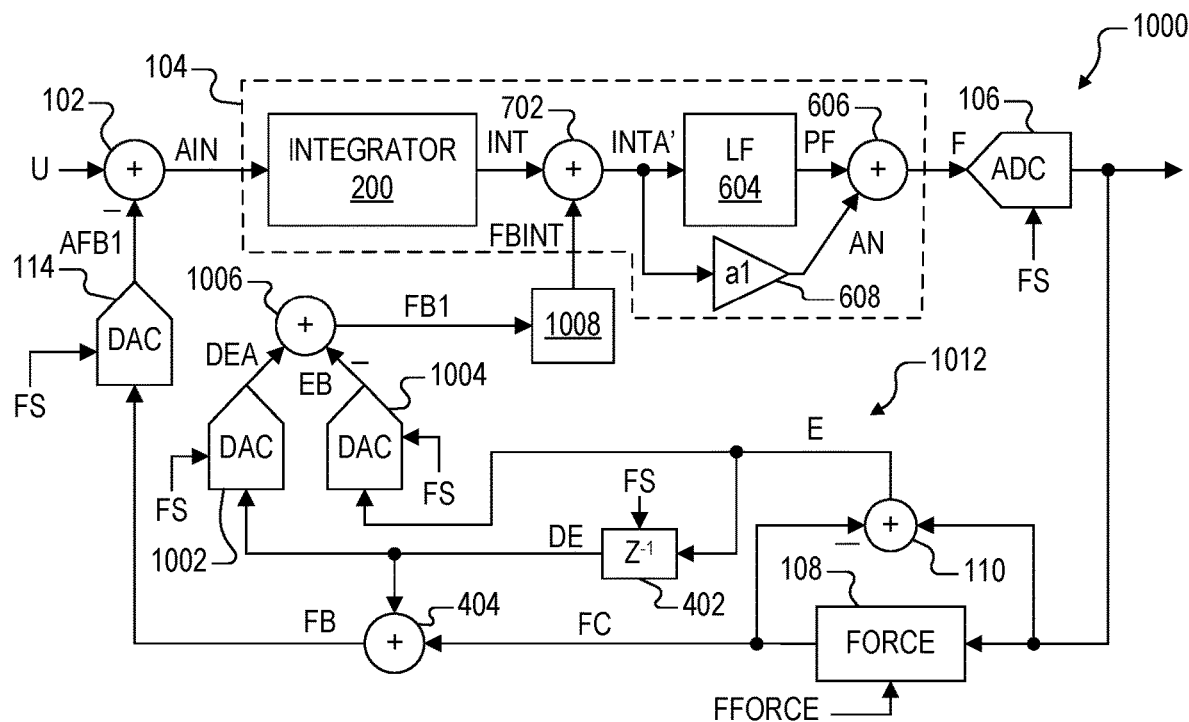

FIG. 10 is a simplified block diagram of another ΔΣ modulator 1000 configured as an ΔΣ ADC with force-and-correction implemented according to yet another embodiment of the present disclosure. The ΔΣ modulator 1000 includes similar components as the ΔΣ modulator 600 in which similar components assume identical reference numbers. In particular, the ΔΣ modulator 1000 includes the input combiner 102, the loop filter circuitry 104, the ADC 106, the force circuitry 108, the force combiner 110, and the DAC 114 coupled in substantially the same manner, in which the loop filter circuitry 104 includes the integrator 200 with or without choppers, the intermediate combiner 702, the loop filter 604, the amplifier 608 and the output combiner 606 coupled in substantially similar manner for converting the analog input signal U to the digital output signal V.

The force correction circuitry 112 for the ΔΣ modulator 1000 is implemented as force correction circuitry 1012 which includes the delay circuitry 402 and the digital combiner 404 providing FB to the DAC 114, along with additional DACs 1002 and 1004, an analog combiner 1006, and another integrator 1008 which is configured in substantially identical manner as the integrator 200 without choppers and having the same transfer function. The DAC 1002 has an input receiving DE and an output providing a signal DEA, and the DAC 1004 has an input receiving E and an output providing a signal EB. The combiner 1006 combines the DEA and EB signals to provide an output feedback signal FB1, which is provided to an input of the integrator 1008. In one embodiment, EB is subtracted from DEA by the combiner 1006 to develop FB1. The integrator 1008 provides an integrated feedback signal FBINT to the other input of the intermediate combiner 702. The DACs 1002 and 1004 may have any suitable gains determined empirically to achieve best results in a given configuration. In one embodiment, the DACs 1002 and 1004 may be configured as multi-tap FIRDACs or the like.

The integrator 1008 is a replica of the first integrator 200 (except without choppers) and is added to create a triangular compensation signal FBINT, which is added to INT to generate a modified adjusted integrated signal INTA' at the output of the intermediate combiner 702. In this configuration, very little error is injected in the rest of the loop filter circuitry 104 and the ΔΣ modulator 1000 operates substantially closer to the ideal configuration. Besides the added complexity of an extra integrator, a drawback of the ΔΣ modulator 1000 is that the extra integrator 1008 operates in an open-loop condition. Thus, for example, if the integrator 1008 has any offset, which most practical integrators do, the output FBINT may drift away and clip to the supply voltage if this offset is not counteracted with an additional control loop.

Figure 11:
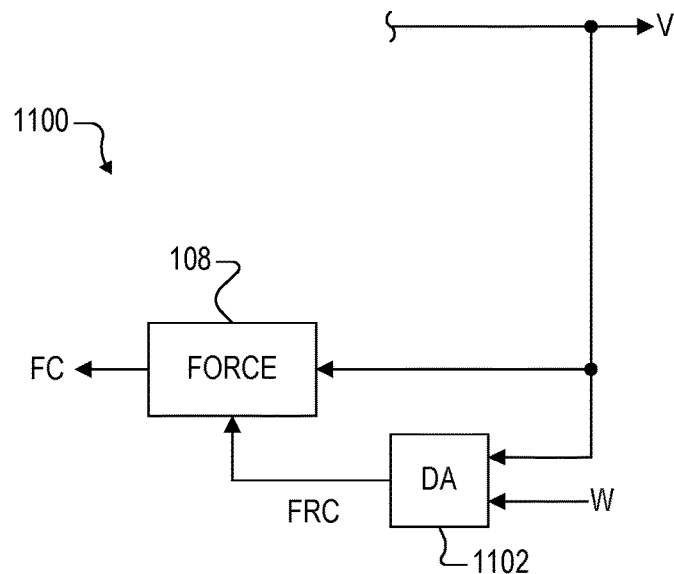
FIG. 11 is a simplified block diagram of an alternative configuration of the force algorithm according to another embodiment of the present disclosure.

FIG. 11 is a simplified block diagram of an alternative force algorithm configuration 1102 implemented the according to another embodiment of the present disclosure. The force circuitry 108 is included having an input receiving V and an output providing FC in a similar manner as previously described. In this case, a digital algorithm (DA) block 1102 is also included having a first input receiving V, a second input receiving an external signal W, and an output providing a force signal FRC provided to the "clock" input of the force circuitry 108. The DA block 1102 generates FRC based on one or both of V and W for asserting the force algorithm. The force algorithm configuration 1102 may be used instead of only the force circuitry 108 in any of the ΔΣ modulator configurations described herein.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage or error levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A delta-sigma modulator with force-and-correction, comprising:
an input analog combiner that is configured to combine an input analog signal with at least one analog feedback signal for providing an adjusted input signal;
loop filter circuitry having an input receiving the adjusted input signal and having an output providing a filtered analog signal;
an analog to digital converter having an input receiving the filtered analog signal and having an output providing an output digital signal;
force circuitry having an input receiving the output digital signal and having an output providing a forced digital signal having a predetermined force state based on a force control signal;
a digital force combiner that is configured to subtract the forced digital signal from the output digital signal for providing a digital error signal;
first digital to analog converter circuitry configured to receive a digital feedback signal based on the forced digital signal and to provide the at least one analog feedback signal; and
force correction circuitry configured to convert the digital error signal into at least one analog error correction signal applied to at least one other input of the loop filter circuitry.

2. The delta-sigma modulator of claim 1, wherein the force correction circuitry comprises:
delay circuitry having an input coupled to receive the digital error signal and having an output providing a delayed digital error signal; and
a digital combiner that is configured to combine the delayed digital error signal with the forced digital signal to provide the digital feedback signal to an input of the first digital to analog converter circuitry.

3. The delta-sigma modulator of claim 1, wherein the force correction circuitry comprises:
delay circuitry having an input coupled to receive the digital error signal and having an output providing a delayed digital error signal;
wherein the first digital to analog converter circuitry is configured to convert the forced digital signal to a first analog feedback signal; and
second digital to analog converter circuitry configured to convert the delayed digital error signal to a second analog feedback signal;
wherein the input analog combiner is configured to subtract the first and second analog feedback signals from input analog signal to provide the adjusted input signal.

4. The delta-sigma modulator of claim 1, wherein:
the loop filter circuitry comprises:
an integrator having an input receiving the adjusted input signal and having an output providing an integrated analog signal;
a loop filter having an input receiving the integrated analog signal and having an output providing a preliminary filtered analog signal;
gain circuitry having an input receiving the integrated analog signal and having an output providing an amplified analog signal; and
an output analog combiner that is configured to combine the preliminary filtered analog signal with the amplified analog signal and a first analog error correction signal for providing the analog filtered signal; and
wherein the force correction circuitry comprises second digital to analog converter circuitry configured to convert the digital error signal to the first analog error correction signal provided to the output analog combiner.

5. The delta-sigma modulator of claim 4, wherein:
the loop filter circuitry further comprises an intermediate analog combiner having a first input receiving the integrated analog signal, having a second input receiving a second analog error correction signal and having an output providing an adjusted intermediate analog signal which is instead provided to the input of the loop filter; and
wherein the force correction circuitry further comprises third digital to analog converter circuitry configured to convert the digital error signal to the second analog error correction signal provided to the second input of the intermediate analog combiner.

6. The delta-sigma modulator of claim 5, wherein the force correction circuitry further comprises:
delay circuitry having an input coupled to receive the digital error signal and having an output providing a delayed digital error signal; and
a digital combiner that combines the delayed digital error signal with the forced digital signal to provide the digital feedback signal provided to an input of the first digital to analog converter circuitry.

7. The delta-sigma modulator of claim 6, further comprising:
a digital noise cancellation filter having an input receiving the digital error signal and having an output providing a filtered digital error signal; and
a second output digital combiner that is configured to combine the filtered digital error signal with the output digital signal for providing a filtered output digital signal.

8. The delta-sigma modulator of claim 5, wherein the first digital to analog converter circuitry is configured to convert the forced digital signal to a first analog feedback signal, and wherein the force correction circuitry further comprises:
delay circuitry having an input coupled to receive the digital error signal and having an output providing a delayed digital error signal; and
fourth digital to analog converter circuitry configured to convert the delayed digital error signal to a second analog feedback signal;
wherein the input analog combiner is configured to subtract the first and second analog feedback signals from input analog signal.

9. The delta-sigma modulator of claim 8, further comprising:

a digital noise cancellation filter having an input receiving the digital error signal and having an output providing a filtered digital error signal; and a second output digital combiner that is configured to combine the filtered digital error signal with the output digital signal for providing a filtered output digital signal.

10. The delta-sigma modulator of claim 1, wherein:
the loop filter circuitry comprises:
   a first integrator having an input receiving the adjusted input signal and having an output providing an integrated analog signal;
   an intermediate analog combiner having a first input receiving the integrated analog signal, having a second input receiving an error correction signal and having an output providing an adjusted integrated analog signal;
   a loop filter having an input receiving the adjusted integrated analog signal and having an output providing a preliminary filtered analog signal;
   gain circuitry having an input receiving the integrated analog signal and having an output providing an amplified analog signal; and
   an output analog combiner is configured to combine the preliminary filtered analog signal with the amplified analog signal and a first analog error signal for providing the analog filtered signal; and
wherein the force correction circuitry comprises:
   delay circuitry having an input coupled to receive the digital error signal and having an output providing a delayed digital error signal;
   a digital combiner that combines the delayed digital error signal with the forced digital signal to provide the digital feedback signal provided to the first digital to analog converter circuitry;
   second digital to analog converter circuitry configured to convert the digital error signal to a first analog error signal;
   third digital to analog converter circuitry configured to convert the delayed digital error signal to a second analog error signal;
   a correction analog combiner that combines the first and second analog error correction signals to provide a correction feedback signal; and
   a second integrator configured substantially the same as the first integrator having an input receiving the correction feedback signal and having an output providing the error correction signal.

11. The delta-sigma modulator of claim 1, wherein the loop filter circuitry further comprises chopper circuitry that is configured to chop analog signals of the loop filter circuitry based on a chop signal operating at a chopping frequency.

12. The delta-sigma modulator of claim 11, wherein the force control signal operates at the chopping frequency.

13. The delta-sigma modulator of claim 1, wherein the force control signal is controlled by a digital algorithm based on the output digital signal.

14. A method of reducing delta-sigma modulator error using force-and-correction, comprising:
   combining an input analog signal with at least one analog feedback signal for providing an adjusted input signal;
   loop filtering the adjusted input signal and providing a filtered analog signal;
   converting the filtered analog signal to an output digital signal;
   forcing the output digital signal to a predetermined forced state based on a force control signal for providing a forced digital signal;
   subtracting the forced digital signal from the output digital signal for providing a digital error signal;
   converting a digital feedback signal based on the forced digital signal for providing the at least one analog feedback signal;
   converting the digital error signal into at least one analog error correction signal; and
   correcting the output digital signal by applying the at least one analog error correction signal to the loop filtering.

15. The method of claim 14, further comprising:
   delaying the digital error signal for providing a delayed digital error signal; and
   combining the delayed digital error signal with the forced digital signal for providing the digital feedback signal.

16. The method of claim 14, further comprising:
   delaying the digital error signal for providing a delayed digital error signal;
   wherein the converting a digital feedback signal based on the forced digital signal comprises converting the forced digital signal into a first analog feedback signal;
   converting the delayed digital error signal to a second analog feedback signal; and
   wherein the combining comprises subtracting the first and second analog feedback signals from input analog signal for providing the adjusted input signal.

17. The method of claim 14, further comprising:
   integrating the adjusted input signal and providing an integrated analog signal;
   filtering the integrated analog signal and providing a preliminary filtered analog signal;
   amplifying the integrated analog signal and providing an amplified analog signal;
   combining the preliminary filtered analog signal with the amplified analog signal and a first analog error correction signal for providing the analog filtered signal; and
   converting the digital error signal to the first analog error correction signal.

18. The method of claim 17, further comprising:
   the loop filtering comprising combining the integrated analog signal and a second analog error correction signal and providing an adjusted intermediate analog signal;
   the filtering comprising filtering instead the integrated analog signal for providing a preliminary filtered analog signal; and
   converting the digital error signal to the second analog error correction signal.

19. The method of claim 18, further comprising:
   delaying the digital error signal for providing a delayed digital error signal; and
   combining the delayed digital error signal with the forced digital signal to provide the digital feedback signal.

20. The method of claim 18, further comprising:
   converting the forced digital signal to a first analog feedback signal;
   delaying the digital error signal for providing a delayed digital error signal;
   converting the delayed digital error signal to a second analog feedback signal; and
   subtracting the first and second analog feedback signals from input analog signal for providing the adjusted input signal.

* * * * *